US005619012A

United States Patent [19]

Casali et al.

[11] Patent Number: 5,619,012

[45] Date of Patent: Apr. 8, 1997

[54] HINGED CIRCUIT ASSEMBLY WITH MULTI-CONDUCTOR FRAMEWORK

[75] Inventors: David C. Casali, Glastonbury; John E. Opie, Stony Creek; Solomon Fridman, Farmington, all of Conn.

[73] Assignee: Philips Electronics North America Corporation, New York, N.Y.

[21] Appl. No.: 165,218

[22] Filed: Dec. 10, 1993

[51] Int. Cl.[6] .............................. H01L 23/28; H01R 9/22

[52] U.S. Cl. ........................ 174/52.2; 174/52.4; 439/709; 439/721; 439/723

[58] Field of Search ................................ 174/52.1, 52.2, 174/52.3, 52.4; 257/669, 701, 787; 361/776; 439/709, 719–723

[56] References Cited

U.S. PATENT DOCUMENTS

| | | | |
|---|---|---|---|
| 4,303,297 | 12/1981 | Smart et al. | 339/218 |
| 4,346,396 | 8/1982 | Carroll, II et al. | 357/70 |
| 4,847,730 | 7/1989 | Konno et al. | 333/181 X |
| 5,057,907 | 10/1991 | Ooi et al. | 357/80 |
| 5,166,570 | 11/1992 | Tanahashi | 310/320 |
| 5,305,179 | 4/1994 | Sono et al. | 361/718 |
| 5,444,294 | 8/1995 | Suzuki | 257/666 |
| 5,459,350 | 10/1995 | Date et al. | 257/666 |

FOREIGN PATENT DOCUMENTS

| | | | |
|---|---|---|---|
| 8600928 | 7/1987 | Germany | H05K 7/18 |

*Primary Examiner*—Bot L. Ledynh
*Attorney, Agent, or Firm*—Robert J. Kraus

[57] ABSTRACT

A circuit assembly is made by overmolding, with an electrically insulating material, a unitary framework of electrically conductive material forming coplanar conductors which are connected to each other by an integral structural member. The overmolded material secures the conductors relative to each other and enables portions of the structural member to be severed, electrically isolating the conductors from each other. The overmolded material also positions electrical components having leads that are electrically connected to the conductors. Ends of the conductors are formed into terminals which extend out of a hinge formed in the overmolded material. The hinge enables the terminals to be oriented in a different plane than the conductors.

7 Claims, 7 Drawing Sheets

HINGED CIRCUIT ASSEMBLY WITH MULTI-CONDUCTOR FRAMEWORK

BACKGROUND OF THE INVENTION

1. Field of the Invention

This invention relates to circuit assemblies, and in particular to such assemblies including electrical components and support means which are overmolded with an electrically insulating material.

2. Description of Related Art

In many applications, such as automotive applications, it is desirable to provide weatherproof circuit assemblies of small size which will withstand severe environmental conditions, including shocks, vibration, moisture and large temperature swings. A particularly effective approach is to form such an assembly as an integral unit including electrical components interconnected by electrical conductors, which are all overmolded by a plastic material. It is, however, difficult and time consuming to manufacture such assemblies.

One difficulty arises from the need to support the electrical components and the electrical conductors while they are being overmolded. This typically involves the inclusion in the assembly of an insulating substrate for supporting the components, the electrical conductors, and electrical terminals to which the conductors and/or the components are connected. This adds to the parts cost, size and manufacturing time of the circuit assembly.

Another difficulty relates to the orientation of the electrical terminals, which typically extend out of the molded portion of the assembly to enable external electrical connection to the internal electrical components. To simplify the mold construction and facilitate insertion of the terminals into the mold, it is desirable that the cavities for receiving the terminals are in the form of corresponding grooves parallel to and extending along paring faces of the mold. This avoids the difficulty of inserting the terminals in tightly-fitting bore holes formed in the mold. However, it limits the direction at which the terminals extend out of the finished circuit assembly to those directions which lie in the plane defined by the parting faces of the mold.

SUMMARY OF THE INVENTION

It is an object of the invention to provide an overmolded circuit assembly which does not require inclusion in the assembly of an insulating substrate to support the components and interconnecting electrical conductors.

It is another object of the invention to provide such an overmolded circuit assembly which enables the terminals to be received in grooves extending along parting faces of the mold without limiting the final direction in which the terminals extend to one which lies in the plane defined by the parting faces.

In accordance with the invention, a circuit assembly is made by forming a unitary framework of electrically conductive material comprising electrical conductors connected to each other by structural members. This framework serves as both a support means and a means for providing electrical interconnections. Electrical component leads are connected to respective ones of the electrical conductors and at least part of the framework is overmolded with an electrically insulating material to support the electrical conductors independently of the structural members. Those structural members which connect ones of the electrical conductors that are not to be electrically connected to each other are then severed.

In a preferred form of the invention, an end of one or more of the electrical conductors comprise respective terminals which extend out of a hinge formed in the overmolded electrically insulating material. The hinge comprises a narrowed section of the material disposed between first and second relatively thick sections of the material. The narrowed section extends in a first direction and the one or more conductors pass through the narrowed section in a second direction transverse to the first direction. This integrally-molded hinge may be bent at its narrowed section, after the circuit assembly is formed, to orient the one or more terminals in a different direction than that in which they layed in the mold. In one particularly advantageous embodiment of the invention, the hinge is bent to orient a plurality of the terminals in a predetermined direction and then the circuit assembly, excluding a length of the terminals, is overmolded to form an electrical connector assembly.

DESCRIPTION OF THE PREFERRED EMBODIMENTS

First Embodiment

FIGS. 1 through 5 illustrate the making of an overmolded circuit assembly in accordance with a first embodiment of the invention.

Figure 1A:
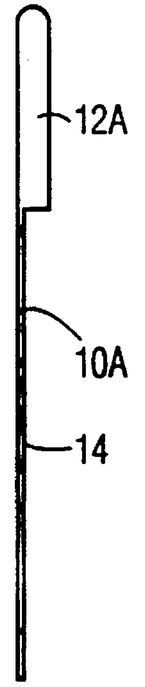
FIGS. 1A and 1B are left side and front views, respectively, of a conductive framework for a first embodiment of a circuit assembly in accordance with the invention.
Figure 1B:
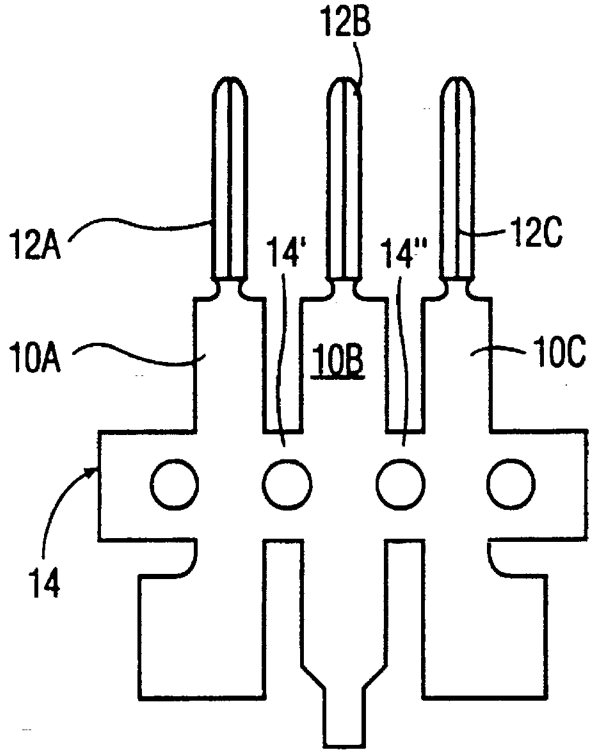

FIGS. 1A and 1B illustrate a framework which has been stamped from a sheet of electrically conductive material such as tin-plated brass. The framework includes a plurality of coplanar conductors 10A, 10B, 10C ending in terminals 12A, 12B, 12C, respectively, that have been formed into tubular shapes from the conductive sheet in a die after the stamping of the framework. Alternatively, the terminals could be left in their flat state or formed to any other shape that fits a particular application. The framework also includes a structural member in the form of an integral strap 14 including portion 14', which connects conductor 10A to conductor 10B, and portion 14", which connects conductor 10B to conductor 10C. The integral strap 14 includes a number of holes for positioning the strap in the mold. Note that the integral strap 14 can be extended to interconnect a plurality of the frameworks illustrated in FIG. 1B, thereby enabling the simultaneous manufacture of a corresponding plurality of overmolded circuit assemblies.

Figure 2C:
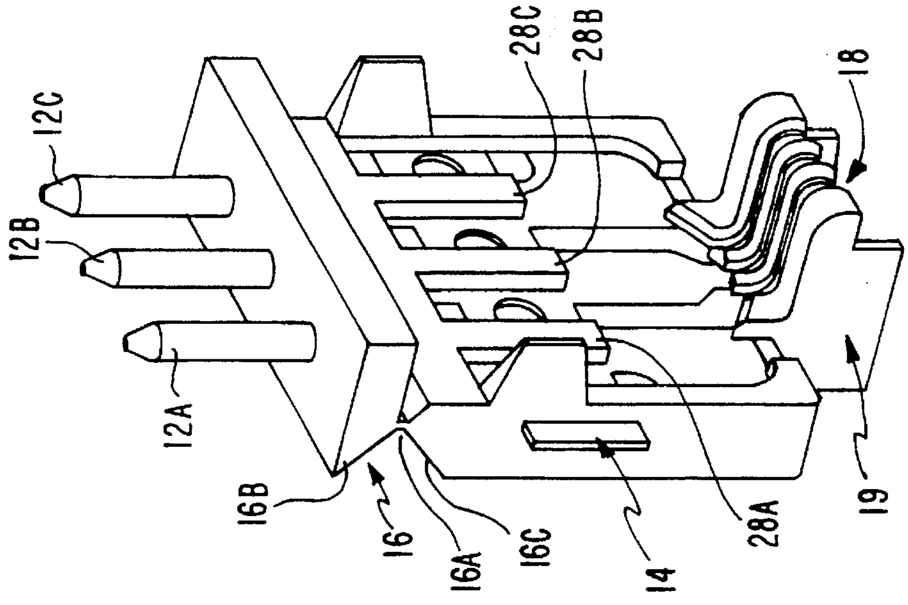
FIGS. 2A, 2B, and 2C are left side, front, and isometric views, respectively, of the conductive framework of FIGS. 1A and 1B, which has been overmolded with a plastic material.
Figure 2B:
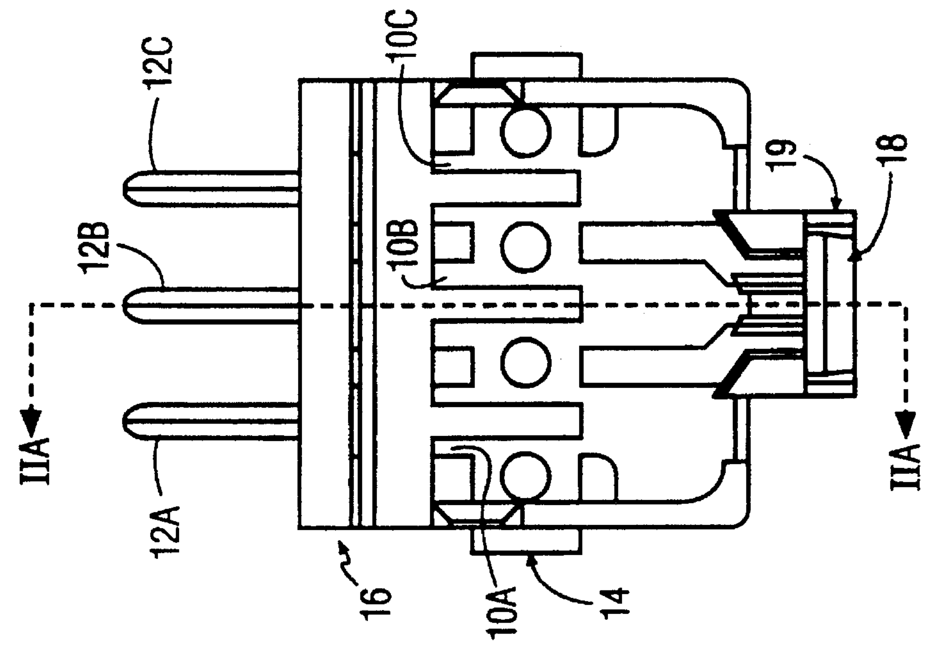
Figure 2A:
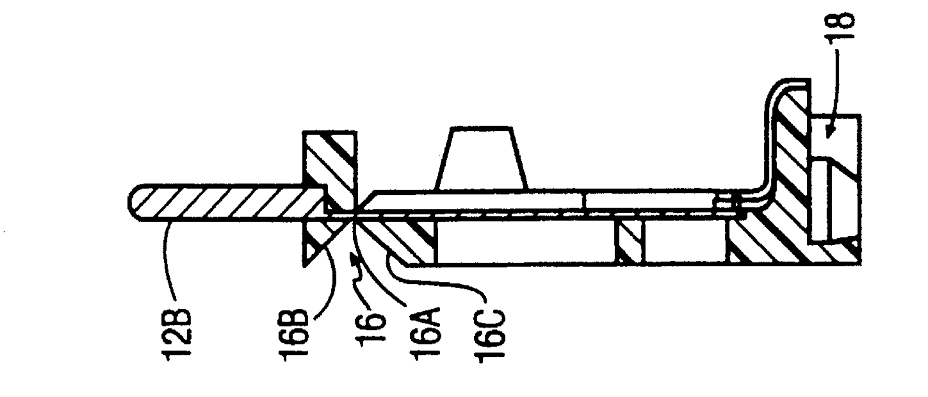

FIGS. 2A, 2B, and 2C illustrate the electrically conductive framework of FIGS. 1A and 1B after it has been partially overmolded with an electrically insulating material. A preferred molding material is a plastic material which retains its integrity over the full range of operating temperatures to which the circuit assembly is exposed. One such material which has been used successfully in automotive applications is a glass-filled polyethylene terephthalate resin sold by E. I. DU PONT DE NEMOURS & CO. under the tradename Rynite 530. The overmolding in this embodiment performs several functions. It forms an integral hinge 16, secures the conductors in their already-established positions relative to each other to permit severing of the strap 14, forms receiving spaces for electrical components, and forms guides for the leads of the electrical components.

The integral hinge 16 is best illustrated in the cross-sectional view of FIG. 2A (taken along the line IIA—IIA of FIG. 2B) and in the isometric view of FIG. 2C. The hinge is formed by portions of the overmolded plastic material and of the conductors. It includes a narrowed section of the plastic material 16A which is disposed between first and second relatively thick sections (having faces 16B and 16C, respectively) and the portions of the conductors 10A, 10B, and 10C which pass through and are embedded in these sections.

The three plastic sections and the embedded portions of the conductors cooperate to form a hinge that can be bent permanently at the narrowed section 16A through a predetermined angle defined by the faces 16B, 16C. (In this exemplary embodiment, the angle selected for the faces is 90°.) The incorporation of the hinge enables the overmolding to be achieved with the conductive framework laid in corresponding grooves along parting faces of the mold, with the narrowed section extending in a direction transverse to the direction of the conductors. At any time after removal, the resulting overmolded framework shown in FIGS. 2A, 2B, 2C can be bent at the narrowed section to orient the terminals 12A, 12B, 12C, which extend from one of the relatively thick sections, to the predetermined angle. As is apparent from FIG. 2A, 2B, 2C, in a preferred embodiment the narrowed section has substantially the same thickness as the conductive framework and the plastic material in this section fills spaces between the conductors and beside the outer conductors. This simplifies the construction of the mold, because only a single, uniform-dimension gap need be provided between the parting faces of the mold for both the conductors and the adjacent plastic material.

Figure 3:
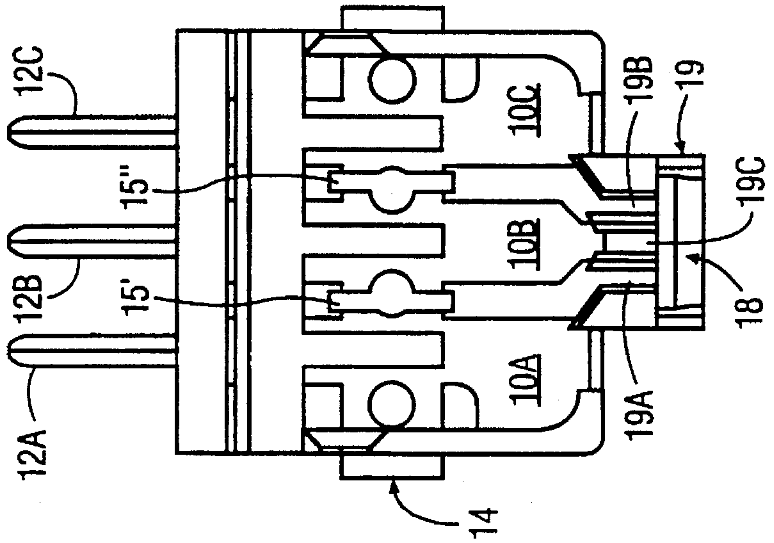
FIG. 3 is a front view of the overmolded framework of FIGS. 2A, 2B, and 2C, which has been punched to sever selected portions of the framework.

FIG. 3 shows the overmolded conductive framework of FIGS. 2A, 2B, 2C after the portions 14' and 14" of the integral strap have been severed by punching respective openings 15' and 15" through the framework, and part of the overmolded plastic, to electrically isolate the conductors 10A, 10B and 10C from each other.

Figure 4B:
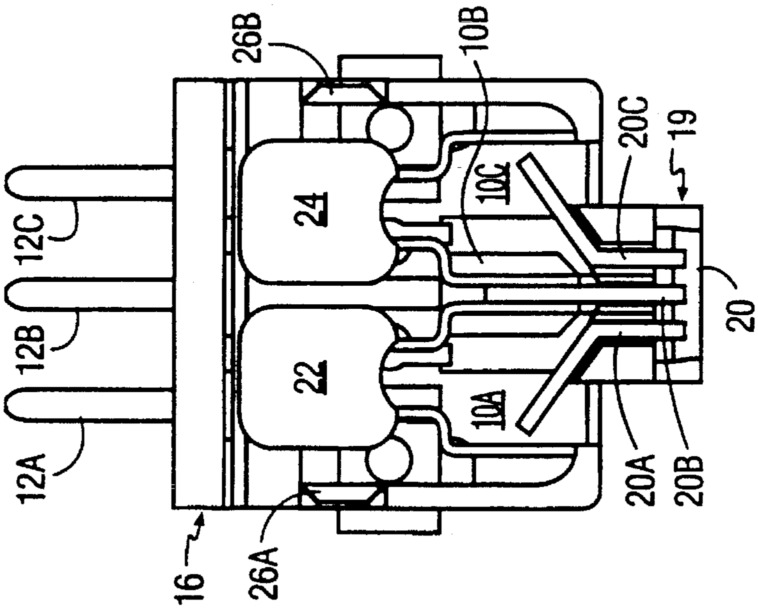
FIGS. 4A and 4B are left side (partly in section) and front views, respectively, of a circuit assembly formed by attaching electrical components to the overmolded conductive framework of FIG. 3.
Figure 4A:
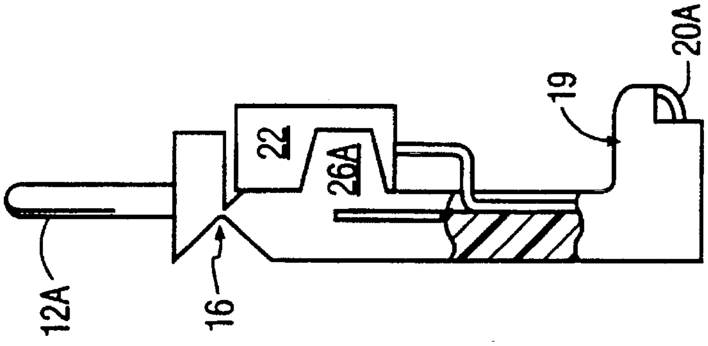

FIGS. 4A and 4B illustrate the overmolded framework of FIG. 3 after electrical components have been added to produce a circuit assembly. This particular circuit assembly is a magnetic position sensor for sensing the movement of a magnetic member, such as a magnet attached to a camshaft in an automotive engine. The components include a Hall cell 20 disposed in an end pocket 18 (shown in FIGS. 2A, 2B, and 2C) of an integrally-molded holder 19 and two capacitors 22 and 24 disposed in a central compartment which is bounded by the hinge 16, the holder 19 and two integrally-molded tabs 26A, 26B. The holder 19 includes three grooves 19A, 19B, 19C (best seen in FIGS. 2C and 3) for guiding respective electrical leads 20A, 20B, 20C of the Hall cell to the conductors 10A, 10B, 10C, respectively, where the leads are connected by resistance welding. The central compartment includes tabs 28A, 28B, 28C molded onto the respective conductors 10A, 10B, 10C to space the capacitors 22, 24 at a small distance from the conductors. The leads of the capacitors are bent as shown in FIG. 4A and resistance welded to the conductors. In the exemplary embodiment illustrated, one lead of each capacitor is connected to a respective one of the outer conductors 10A, 10C and each of the other capacitor leads is connected to the central conductor 10B.

Figure 5A:
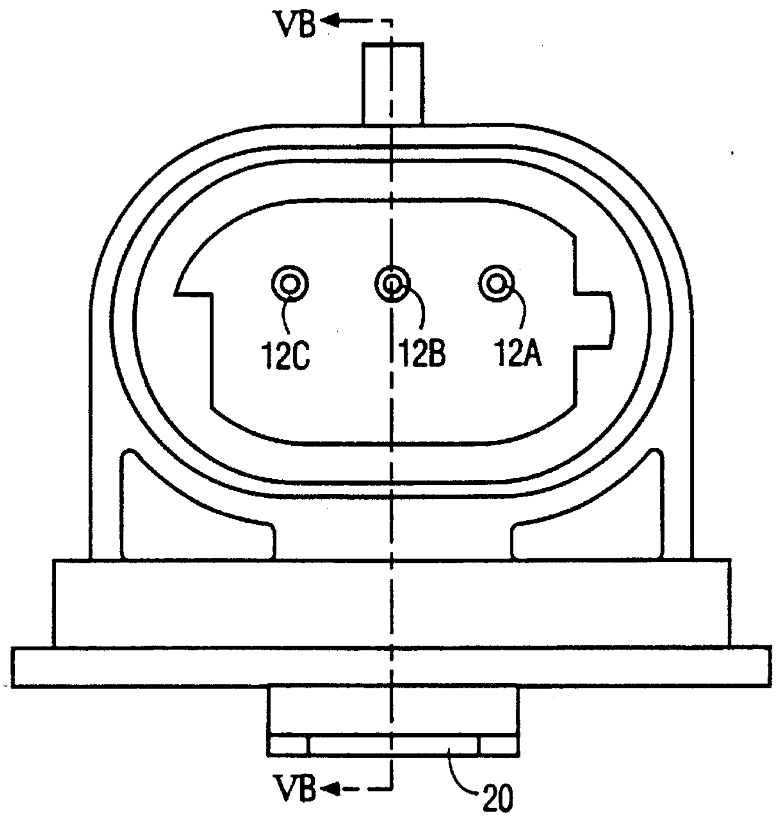
FIGS. 5A and 5B are top and sectional views of a circuit assembly which has been formed by overmolding the circuit assembly of FIGS. 4A and 4B to form an integral connector.
Figure 5B:
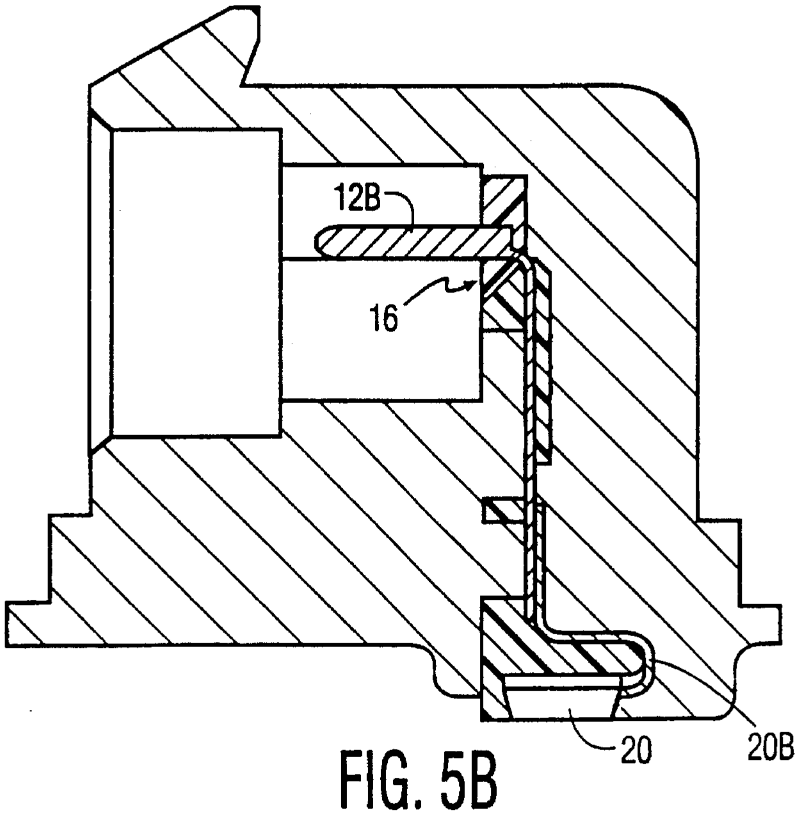

FIGS. 5A and 5B show the circuit assembly of FIGS. 4A and 4B which has itself been overmolded to provide a new circuit assembly including an electrical connector. As is most clearly seen by comparing FIG. 4A with the cross section of FIG. 5B (taken along the line VB—VB), the connector is provided by overmolding all but the terminals 12*a*, 12*b*, 12*c*, the face of the hinge 16 out of which the terminals extend, and the face of the Hall cell 20, after the hinge has been bent to the 90° orientation with respect to the plane of the conductors 10A, 10B, 10C. This enables the Hall cell to be disposed close to the magnetic member being sensed and leaves the terminals free to connect with complementary terminals in a mating connector (not shown).

Second Embodiment

FIGS. 6 through 11 illustrate the making of an overmolded circuit assembly in accordance with a second embodiment of the invention.

As in the first embodiment, the manufacturing process begins with the stamping of a framework from a sheet of electrically conductive material such as tin-plated brass. This framework, illustrated in FIGS. 6A and 6B, includes a plurality of coplanar conductors 30A, 30B, 30C, ending in terminals 32A, 32B, 32C, respectively, and first and second structural members in the form of first and second integral straps 34A and 34B, respectively. Each strap includes a portion 34', which connects conductor 30A to conductor 30B, and a portion 34", which connects conductor 30B to conductor 30C. Each strap further includes two holes which are located for positioning it in a mold. As in the case of the first embodiment, each strap can be extended to interconnect a plurality of the frameworks, thereby enabling the simultaneous manufacture of a corresponding plurality of overmolded circuit assemblies.

Figure 7B:
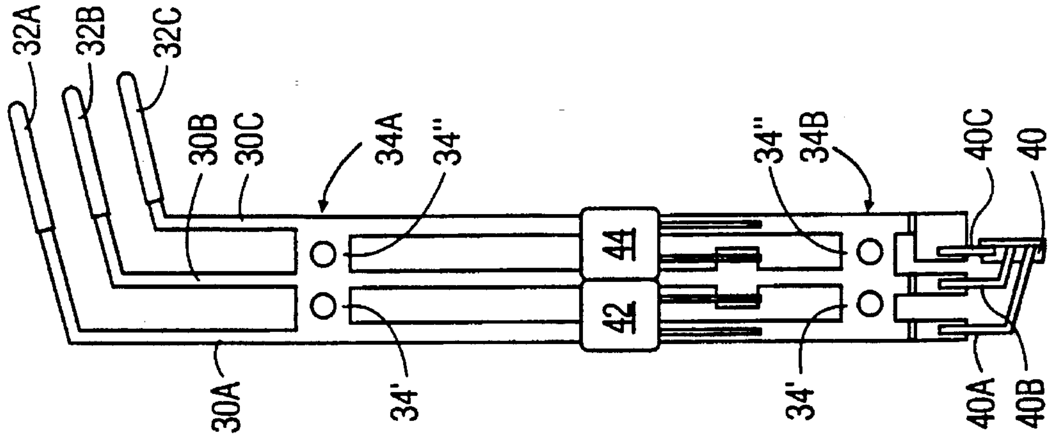
FIGS. 7A and 7B are left side and front views, respectively, of the conductive framework of FIGS. 6A and 6B to which electrical components have been attached.
Figure 7A:
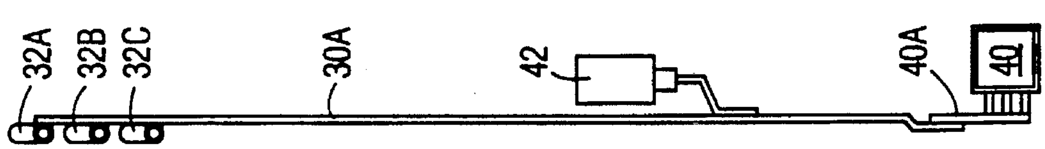
Figure 6B:
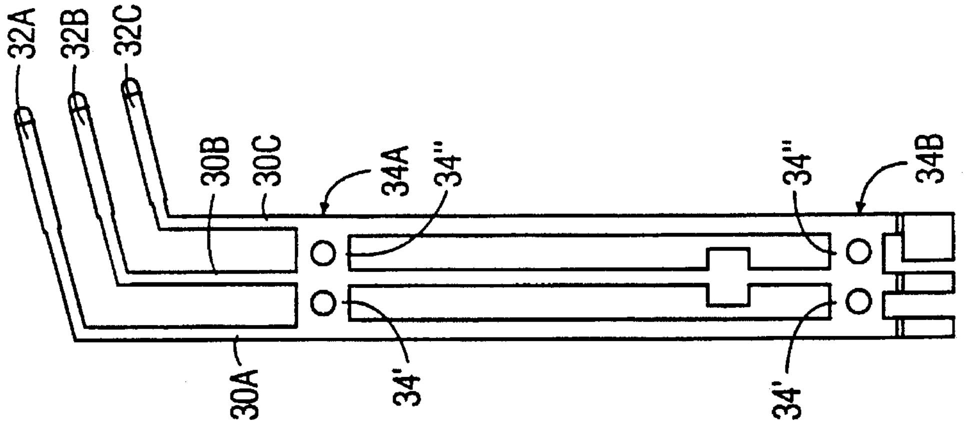
FIGS. 6A and 6B are left side and front views, respectively, of a conductive framework for a second embodiment of a circuit assembly in accordance with the invention.
Figure 6A:
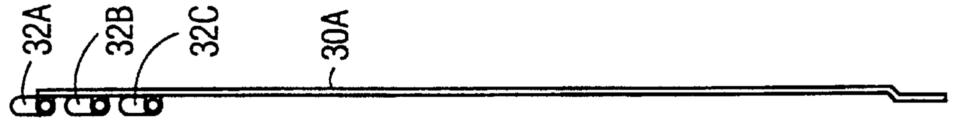

FIGS. 7A and 7B illustrate the framework of FIG. 6 after electrical components, similar to those in the first embodiment, have been added. The components include a Hall cell 40 and two capacitors 42, 44. The Hall cell has three leads 40A, 40B, 40C which are connected to respective ends of the conductors 32A, 32B, 32C by resistance welding. Similarly, one lead of each capacitor is connected to a respective one of the outer conductors 30A, 30C and each of the other capacitor leads is connected to the central conductor 30B.

Figure 8B:
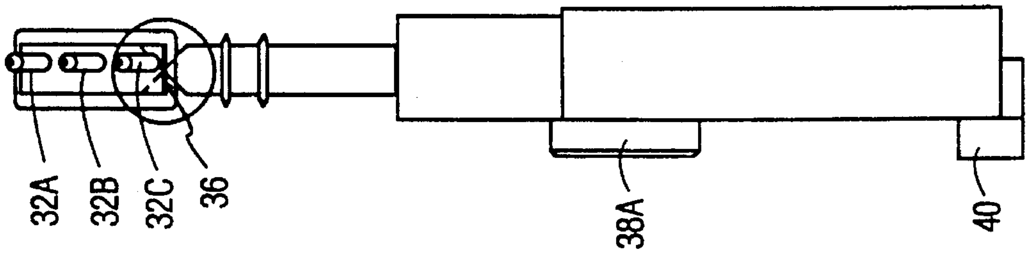
FIGS. 8A and 8*b* are front and side views, respectively, of the conductive framework with electrical components of FIGS. 7A and 7B which have been overmolded with a plastic material.
Figure 8A:
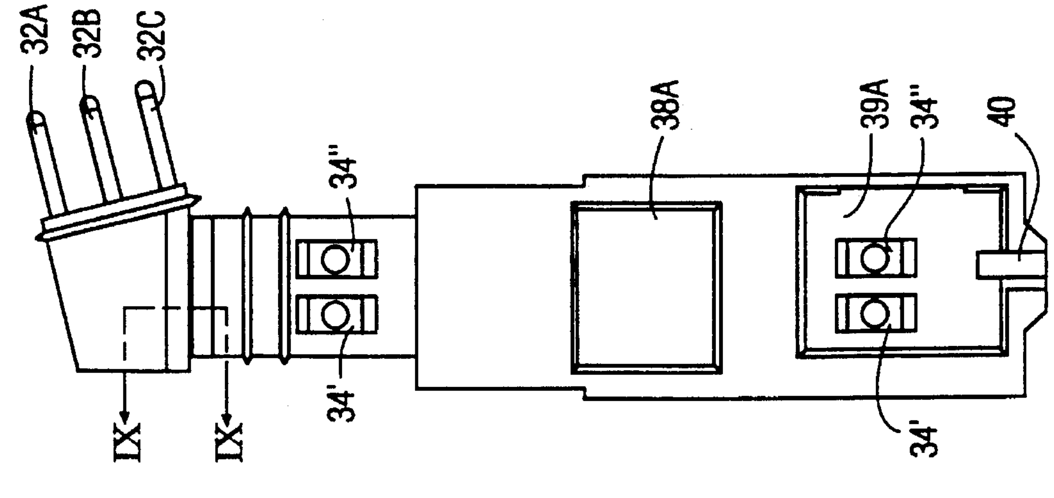
Figure 11:
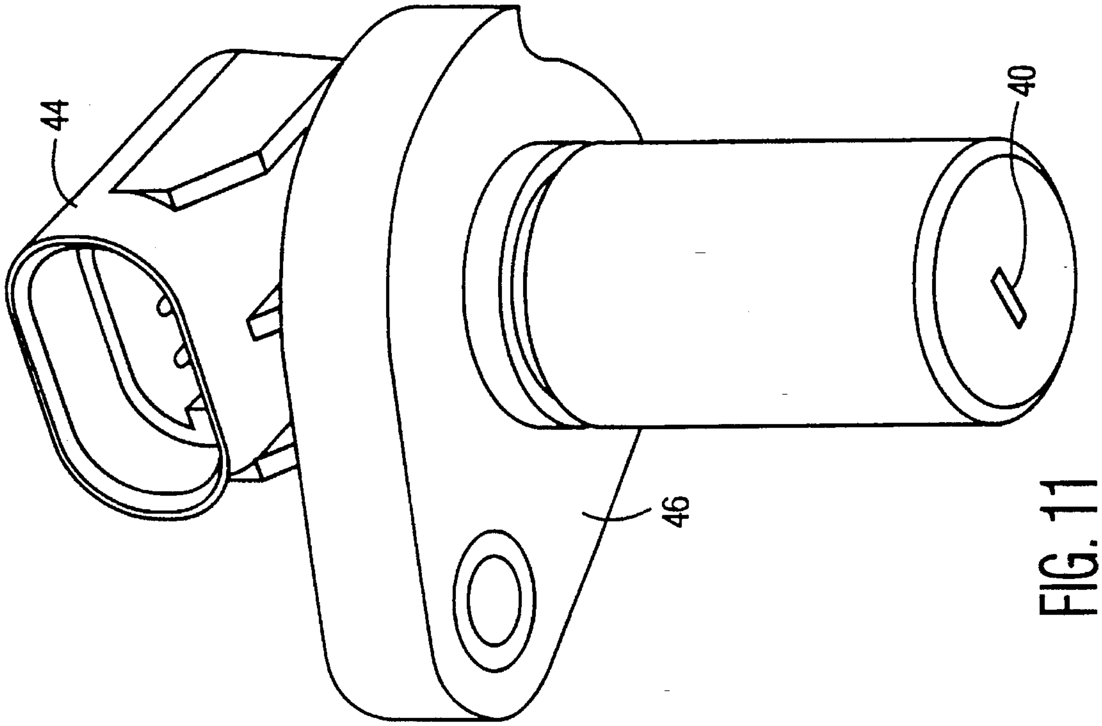
FIG. 11 is an isometric view of a circuit assembly which has been formed by overmolding the assembled parts of FIG. 10 to form an integral connector and mounting flange.

FIGS. 8A and 8B show the conductive framework and electrical components of FIG. 7 after they have been partially overmolded with an electrically insulating material such as the glass-filled polyethylene terephthalate resin used in the manufacture of the first embodiment. As in the case of the first embodiment, the overmolding in this embodiment performs several functions. It forms an integral hinge 36, secures the conductors in their already-established positions relative to each other to permit severing of the straps 34A and 34B, and secures the electrical components and their leads in their already-established positions relative to the conductors.

Figure 9:
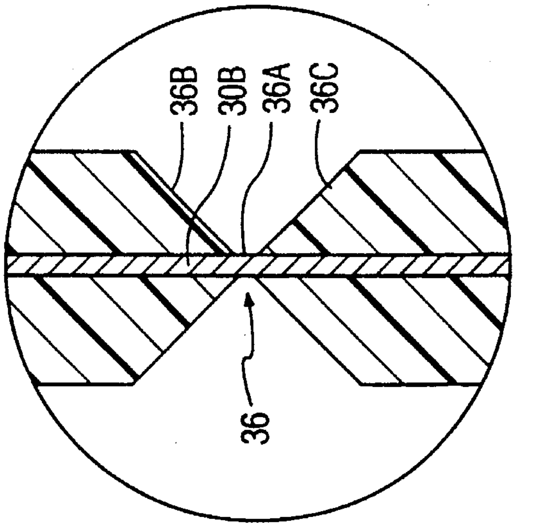
FIG. 9 is an enlarged cross section of a portion of the overmolded framework of FIGS. 8A and 8B.

The integral hinge 36 is best illustrated in the magnified cross section shown in FIG. 9, which is taken along the line IX—IX of FIG. 8A and circled in FIG. 8B. It includes a narrowed section of the plastic material 36A which is disposed between first and second relatively thick sections (having faces 36B and 36C, respectively) and the portions of the conductors 30A, 30B, 30C which pass through and are embedded in these sections. Only conductor 30B is visible, in the cross section of FIG. 9.

Similarly to the first embodiment, the faces 36B and 36C define a predetermined angle (again 90°) through which the hinge can be bent. Again the incorporation of the hinge enables the overmolding to be achieved with the conductive framework laid in corresponding grooves along parting faces of the mold, thus simplifying its construction. However, in this case the terminals 32A, 32B, 32C carried at the end of the conductors 30A, 30B, 30C, respectively, extend at a predetermined angle with respect to the longitudinal direction of the overmolded circuit assembly. By appropriately selecting this angle, along with the angle defined by the faces 36B, 36C, the terminals can be made to extend from the assembly at a compound angle with respect to the longitudinal direction of the assembly.

As can be seen from FIG. 8A, the overmolded circuit assembly also includes four molded slits through which the two strap portions 34' and the two strap portions 34" are located. After overmolding, these four portions are severed by punching to electrically isolate the three conductors 30A, 30B, 30C from each other.

Figure 10:
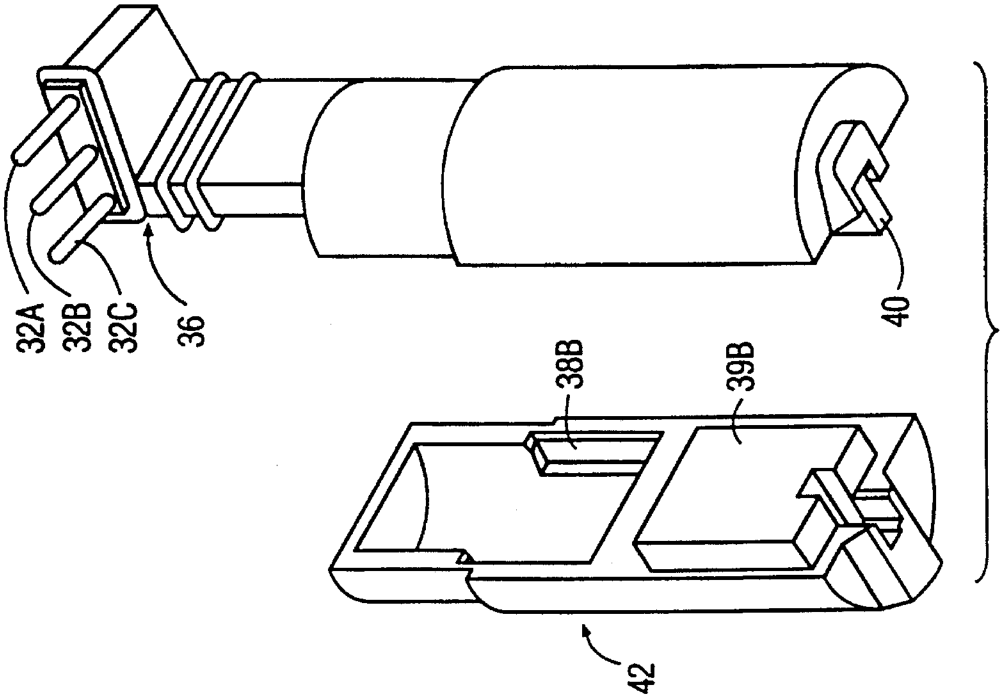
FIG. 10 is an exploded view of a circuit assembly including the overmolded framework part of FIGS. 8A and 8B and of a mating part.

As can be further seen from FIGS. 8A and 8B, the circuit assembly includes molded raised and recessed portions 38A and 39A, respectively, which are utilized to facilitate the positioning and attachment of a cover to the assembly. FIG. 10 illustrates such a cover 42, which is preferably molded from the same plastic material and includes complementary recessed and raised portions 38B and 39B for mating with the portions 38A and 39A, respectively. The cover cooperates with the overmolded circuit assembly to substantially enclose the Hall cell 40 and to form a generally cylindrical surface which may be overmolded along with the terminal portion of the circuit assembly to form an electrical connector. This is done after bending the hinge, as is shown in FIG. 10, to form the assembly illustrated in FIG. 11. Note that the assembly of FIG. 11 includes both the overmolded electrical connector 44 and an overmolded flange 46 facilitating attachment of the overall assembly to an engine or other apparatus such that the Hall cell is proximate the magnetic member being sensed.

We claim:

1. An overmolded circuit assembly comprising:

a. a framework of electrically conductive material comprising electrical conductors which are at least partially overmolded with an electrically insulating material to secure said conductors in predetermined positions relative to each other, said framework including a plurality of severed structural portions for connecting said conductors to each other when in an unsevered state before said conductors are in said overmolded state;

b. at least one electrical component having terminals electrically connected to respective ones of said electrical conductors;

an end of at least one of said electrical conductors comprising a terminal extending out of a hinge formed in said overmolded electrically insulating material, said hinge comprising a narrowed section of said material disposed between first and second relatively thick sections of said material, said narrowed section extending in a first direction and said at least one electrical conductor passing through said narrowed section in a second direction transverse to said first direction.

2. An overmolded circuit assembly as in claim 1 where said terminal extends out of the hinge at a predetermined angle with respect to the second direction.

3. An overmolded circuit assembly as in claim 2 where said angle is determined by abutting faces of said first and second relatively thick sections.

4. An overmolded circuit assembly as in claim 1 where the narrowed section of the hinge comprises a plurality of coplanar electrical conductors and molding material disposed between said coplanar electrical conductors.

5. An overmolded circuit assembly as in claim 1 where the hinge is bent to orient the terminal to a predetermined direction and is overmolded with an electrically insulating material to form an electrical connector.

6. An overmolded circuit assembly as in claim 1 where the electrically insulating material includes at least one portion which is formed for positioning the at least one electrical component in a predetermined location.

7. An overmolded circuit assembly as in claim 1 where the electrically insulating material is molded over the at least one electrical component.

* * * * *